United States Patent
Miller et al.

(10) Patent No.: US 8,928,407 B2
(45) Date of Patent: Jan. 6, 2015

(54) CURRENT CONVEYOR CIRCUIT AND METHOD

(71) Applicant: Futurewei Technologies, Inc., Plano, TX (US)

(72) Inventors: Matthew Richard Miller, Arlington Heights, IL (US); Terrie McCain, Round Lake, IL (US)

(73) Assignee: Futurewei Technologies, Inc., Plano, TX (US)

( * ) Notice: Subject to any disclaimer, the term of this patent is extended or adjusted under 35 U.S.C. 154(b) by 37 days.

(21) Appl. No.: 13/794,442

(22) Filed: Mar. 11, 2013

(65) Prior Publication Data

US 2014/0253233 A1    Sep. 11, 2014

(51) Int. Cl.
*H03F 3/45* (2006.01)
*H03G 3/00* (2006.01)

(52) U.S. Cl.
CPC .............. *H03F 3/45179* (2013.01); *H03G 3/00* (2013.01)
USPC .......................................... 330/254; 330/261

(58) Field of Classification Search
USPC .......................................... 330/254, 261, 257
See application file for complete search history.

(56) References Cited

U.S. PATENT DOCUMENTS

| 7,671,686 B2 * | 3/2010 | Kuo et al. ...................... 330/301 |
| 7,697,915 B2 * | 4/2010 | Behzad et al. ................. 455/311 |
| 8,576,007 B2 * | 11/2013 | Corsi et al. .................... 330/260 |
| 2010/0120377 A1 | 5/2010 | He |
| 2014/0167848 A1 * | 6/2014 | Lee .............................. 330/254 |

FOREIGN PATENT DOCUMENTS

| CN | 1531215 A | 9/2004 |
| CN | 101316105 A | 12/2008 |

OTHER PUBLICATIONS

Xie, Haolu et al., "Single-Chip Multiband EGPRS and SAW-Less LTE WCDMA CMOS Receiver with Diversity," IEEE Transactions on Microwave Theory and Techniques, vol. 60. No. 5, May 2012, pp. 1390-1396.
Wei, F., et al., "Baseband Filter Based on a Single CCCII," Journal of Circuits and Systems, vol. 7, No. 3, Sep. 2002, 2 pages.
International Search Report and Written Opinion for Application No. PCT/CN2014/073221, mailed Jun. 25, 2014, 15 pages.

* cited by examiner

*Primary Examiner* — Henry Choe
(74) *Attorney, Agent, or Firm* — Slater & Matsil, L.L.P.

(57) ABSTRACT

A system includes a first variable gain amplifier configured to receive an input signal and a first down-mixer coupled to the first variable gain amplifier. Also, the system includes a first current conveyor coupled to the first down mixer, where the first current conveyor includes a first cascode and a second cascode coupled to the first cascode. Additionally, the system includes a first channel filter coupled to the first current conveyor and a second variable gain amplifier coupled to the first channel filter.

21 Claims, 5 Drawing Sheets

CURRENT CONVEYOR CIRCUIT AND METHOD

TECHNICAL FIELD

The present invention relates generally to electronic circuits and methods, and in particular to a current conveyor circuit and method.

BACKGROUND

Cellular communications devices contain transceivers, such as radio frequency (RF) transceivers used to receive and transmit radio frequency signals. A super-heterodyne receiver or a direct conversion receiver (DCR) may be used in an RF transceiver to receive an RF signal. A super-heterodyne receiver uses frequency mixing or heterodyning to convert a received signal to a fixed intermediate frequency (IF), which may be more easily processed than the original radio carrier frequency. A direct conversion receiver may be used in an RF transceiver. The DCR demodulates an incoming radio signal using synchronous detection driven by a local oscillator whose frequency is very close or equal to the carrier frequency of the intended signal. In a direct conversion receiver, the radio signal is fed into a frequency mixer, and the frequency of a local oscillator is near the received signal's frequency, resulting in a demodulated output. A direct conversion receiver may include one or more current conveyors. A current conveyor is an electronic amplifier with, ideally, a unity current gain. Current conveyors may perform various analog signal processing functions.

SUMMARY OF THE INVENTION

In accordance with an embodiment, a system includes a first variable gain amplifier configured to receive an input signal and a first down-mixer coupled to the first variable gain amplifier. Also, the system includes a first current conveyor coupled to the first down mixer, where the first current conveyor includes a first cascode and a second cascode coupled to the first cascode. Additionally, the system includes a first channel filter coupled to the first current conveyor and a second variable gain amplifier coupled to the first channel filter.

In accordance with another embodiment, a circuit includes a first transistor including a first gate coupled to a first node, a first source coupled to a second node, a first drain coupled to a third node, and a first bulk coupled to a fourth node and a first terminal of the first resistor coupled to the third node, where a second terminal of the first resistor is coupled to a fifth node. Also, the circuit includes a second transistor including a second gate, a second source, a second drain, and a second bulk, where the second drain of the second transistor is coupled to the second node, where the second gate of the second transistor is coupled to a sixth node, where the second source of the second transistor is coupled to a seventh node, and where the second bulk of the second transistor is coupled to an eighth node. Additionally, the circuit includes a third transistor including a third gate, a third source, a third drain, and a third bulk, where the third gate of the third transistor is coupled to the first node, where the third source is coupled to a ninth node, where the third source of the third transistor is coupled to the ninth node, where the third drain of the third transistor is coupled to a tenth node, and where the third bulk of the third transistor is coupled to an eleventh node. The circuit also includes a third terminal of second resistor coupled to the tenth node, where a fourth terminal of the second resistor is coupled to the fifth node. Additionally, the circuit includes a fourth transistor including a fourth gate, a fourth source, a fourth drain, and a fourth bulk, where the fourth drain of the fourth transistor is coupled to the ninth node, where the fourth gate of the fourth transistor is coupled to the sixth node, where the fourth bulk of the fourth transistor is coupled to the seventh node, and where the fourth source of the fourth transistor is coupled to the eighth node.

In accordance with an additional embodiment, a method of constructing a circuit includes coupling a first terminal of a first resistor to a first drain of a first transistor, where the first transistor includes a first gate, a first source, the first drain, and a first bulk, and where the first resistor includes the first terminal and a second terminal and coupling a second drain of a second transistor to the first source of the first transistor, where the second transistor includes a second gate, a second source, the second drain, and a second bulk and coupling a third gate of a third transistor to the first gate of the first transistor, where the third transistor includes the third gate, a third source, a third drain, and a third bulk. Also, the method includes coupling a third terminal of a second resistor to the third drain of the third transistor, where the second resistor includes the third terminal and a fourth terminal and coupling a fourth drain of a fourth transistor to the third source of the third transistor, where the fourth transistor includes a fourth gate, a fourth source, the fourth drain, and a fourth bulk. Additionally, the method includes coupling the fourth gate of the fourth transistor to the second gate of the second transistor, coupling the fourth bulk of the fourth transistor to the second source of the second transistor, and coupling the fourth source of the fourth transistor to the second bulk of the second transistor.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Figure 1:
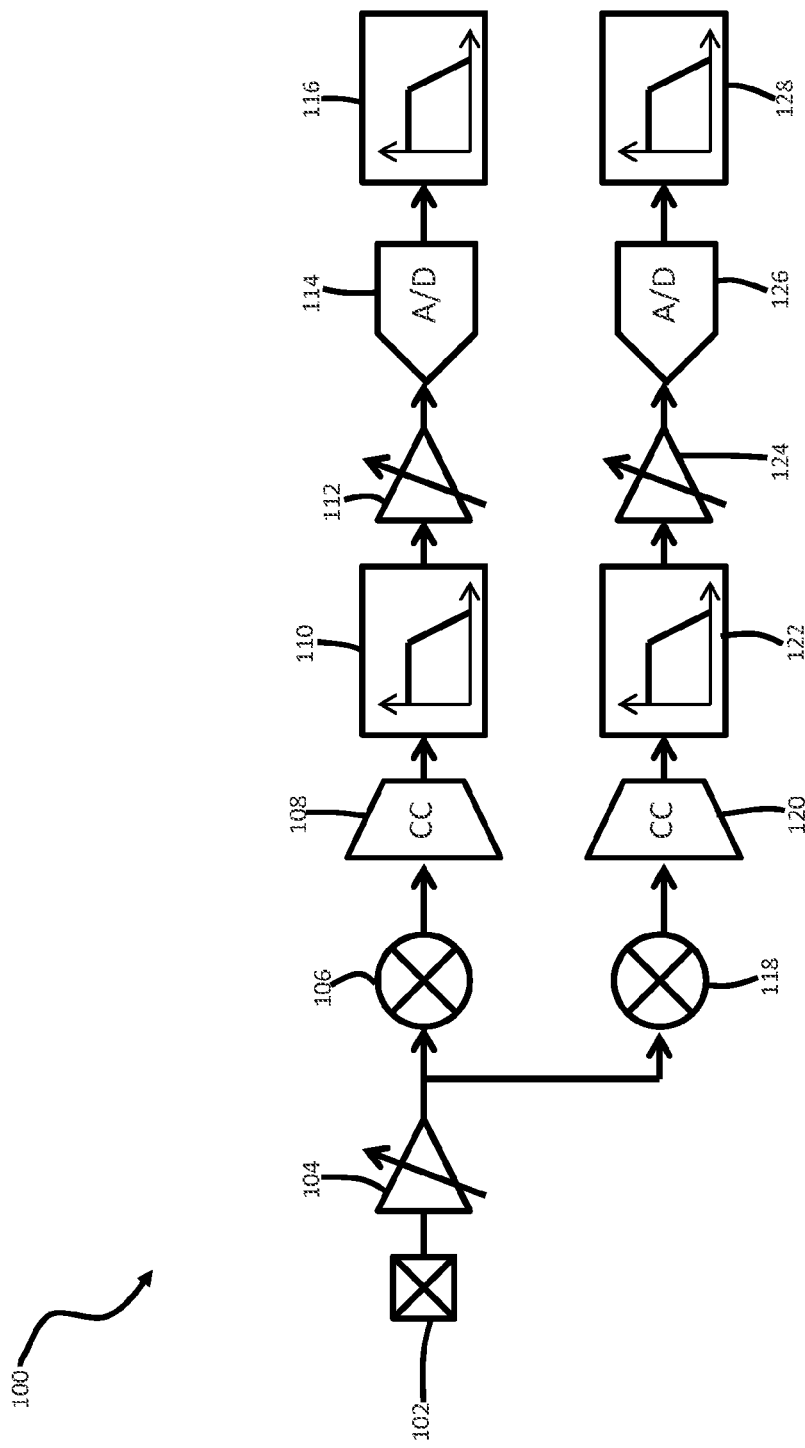
FIG. 1 illustrates a block diagram of an embodiment direct conversion receiver.

FIG. 1 illustrates a block diagram of direct conversion receiver (DCR) 100. Direct conversion receiver 100 demodulates an incoming radio signal using synchronous detection driven by a local oscillator, the frequency of which is very close or equal to the carrier frequency of the intended signal. Also, direct conversion receiver 100 has one mixing step. Radio frequency (RF) input 102 is configured to receive an RF input signal. In an example, RF input 102 is an input pin on an integrated circuit (IC). The RF input signal may be at a frequency of about 2 GHz. Also, the RF input signal may contain an I component and a Q component. Additionally, RF input 102 is coupled to low noise amplifier 104, a variable gain amplifier. The output of low noise amplifier 104 is coupled to down-mixer 106 and down-mixer 118. Two similar chains are created, one beginning with down-mixer 106 and the other beginning with down-mixer 118. One chain is used to process the I component of the RF signal, and the other chain is used to process the Q component of the RF signal. Down-mixer 106 and down-mixer 118 convert the high frequency input signal to a baseband signal with a frequency bandwidth from about 180 kHz to about 20 MHz. In an example, down-mixer 106 and down-mixer 118 are highly linear low impedance mixers with high impedance outputs. Additionally, the output of down-mixer 106 is coupled to current conveyor (CC) 108, while the output of down-mixer 118 is coupled to current conveyor 120. Both current conveyor 108 and current conveyor 120 are electronic amplifiers with unity gains.

Current conveyor 108 is coupled to channel filter 110, and current conveyor 120 is coupled to channel filter 122. Channel filter 110 and channel filter 122 may be low pass filters that attenuate frequencies above a given frequency, which may be from about 180 kHz to about 20 Mhz. Also, channel filter 110 is coupled to variable gain amplifier 112, while channel filter 122 is coupled to variable gain amplifier 124. In one example, low noise amplifier 104, down-mixer 106, current conveyor 108, channel filter 110, variable gain amplifier 112, down-mixer 118, current conveyor 120, channel filter 122, and variable gain amplifier 124 are integrated on a single integrated circuit. Also, variable gain amplifier 112 is coupled to analog-to-digital (A/D) converter 114, while variable gain amplifier 124 is coupled to analog-to-digital converter 126. Finally, analog-to-digital converter 114 is coupled to digital filter 116, and analog-to-digital converter 126 is coupled to digital filter 128. In an example, digital filter 116 and digital filter 128 are implemented in a digital signal processor (DSP).

Figure 2:
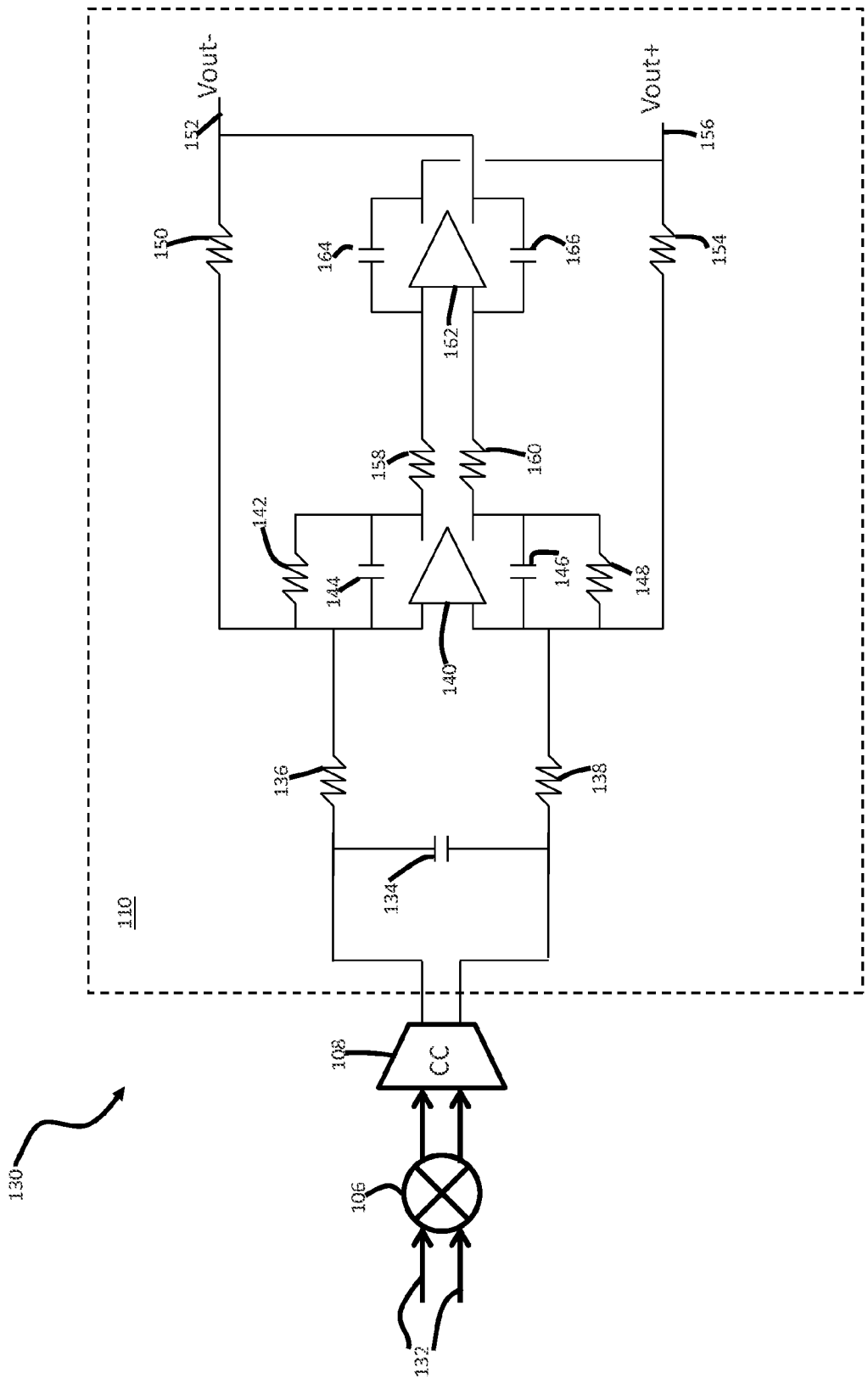
FIG. 2 illustrates a circuit of a portion of a direct conversion receiver.

FIG. 2 illustrates circuit 130, a differential circuit, having down-mixer 106, current conveyor 108, and channel filter 110. Differential inputs 132 are coupled to down-mixer 106, which is coupled to current conveyor 108. Channel filter 110 is a differential low pass filter, which filters out frequencies above the critical frequency. The critical frequency is determined by the values of the resistors and capacitors. In one example, the channel filter is a third order filter whose first order pole is given by:

$$f = \frac{1}{4\pi R_{136} C_{134}},$$

where $R_{136}$ is the resistance of resistor 136, and $C_{134}$ is the capacitance of capacitor 134. Also, the gain of channel filter 110 is given by:

$$\frac{-R_{150}}{R_{136}},$$

where $R_{150}$ is the resistance of resistor 150 and $R_{136}$ is the resistance of resistor 136. Channel filter 110 may be symmetrical. In channel filter 110, capacitor 134 is coupled between the differential outputs of current conveyor 108. The outputs of current conveyor 108 are also, respectively, coupled to resistor 136 and resistor 138. In an example, resistor 136 and resistor 138 have the same resistance, for example 1600 ohms. Resistor 136 and resistor 138 are each coupled to an input of op-amp 140, creating a high input resistance for channel filter 110. This high input resistance is seen by current conveyor 108.

Coupled between the first input of op-amp 140 and a first output of op-amp 140, in parallel, are capacitor 144 and resistor 142. Similarly, coupled between the second input of op-amp 140 and a second output of op-amp 140, in parallel, are capacitor 146 and resistor 148. In an example, resistor 142 has a resistance of about 3500 ohms. All of these components are customized depending on the filter bandwidth. For bandwidths of 200 kHz, capacitor 144 is about 200 pF. For bandwidths of 20 MHz, capacitor 144 is about 2 pF. Capacitor 144 may have the same capacitance as capacitor 146, and resistor 142 may have the same resistance as resistor 148. Resistor 158 is coupled between the first output of op-amp 140 and a first input of op-amp 162, while resistor 160 is coupled between the second output of op-amp 140 and a second input of op-amp 162. In an example, resistor 158 and resistor 160 have the same resistance. For bandwidths of 200 kHz, an example would be about 18 kohms. For bandwidths of 20 MHz, an example would be about 3.8 kohms. The second output of op-amp 162 is coupled to negative output 152, while the first output of op-amp 162 is coupled to positive output 156. Capacitor 164 is coupled between the first input and the first output of op-amp 162, while capacitor 166 is coupled between the second input and the second output of op-amp 162. In an example, the capacitance of capacitor 164 is the same as the capacitance of capacitor 166. The capacitance of capacitors 144, 146, 164, and 166 may be the same capacitance. Finally, resistor 150 is coupled between negative output 152 and the first input of op-amp 140, while resistor 154 is coupled between positive output 156 and the second input of op-amp 140. In an example, resistor 150 and resistor 154 have the same resistance, which may be about 4900 ohms.

Figure 3:
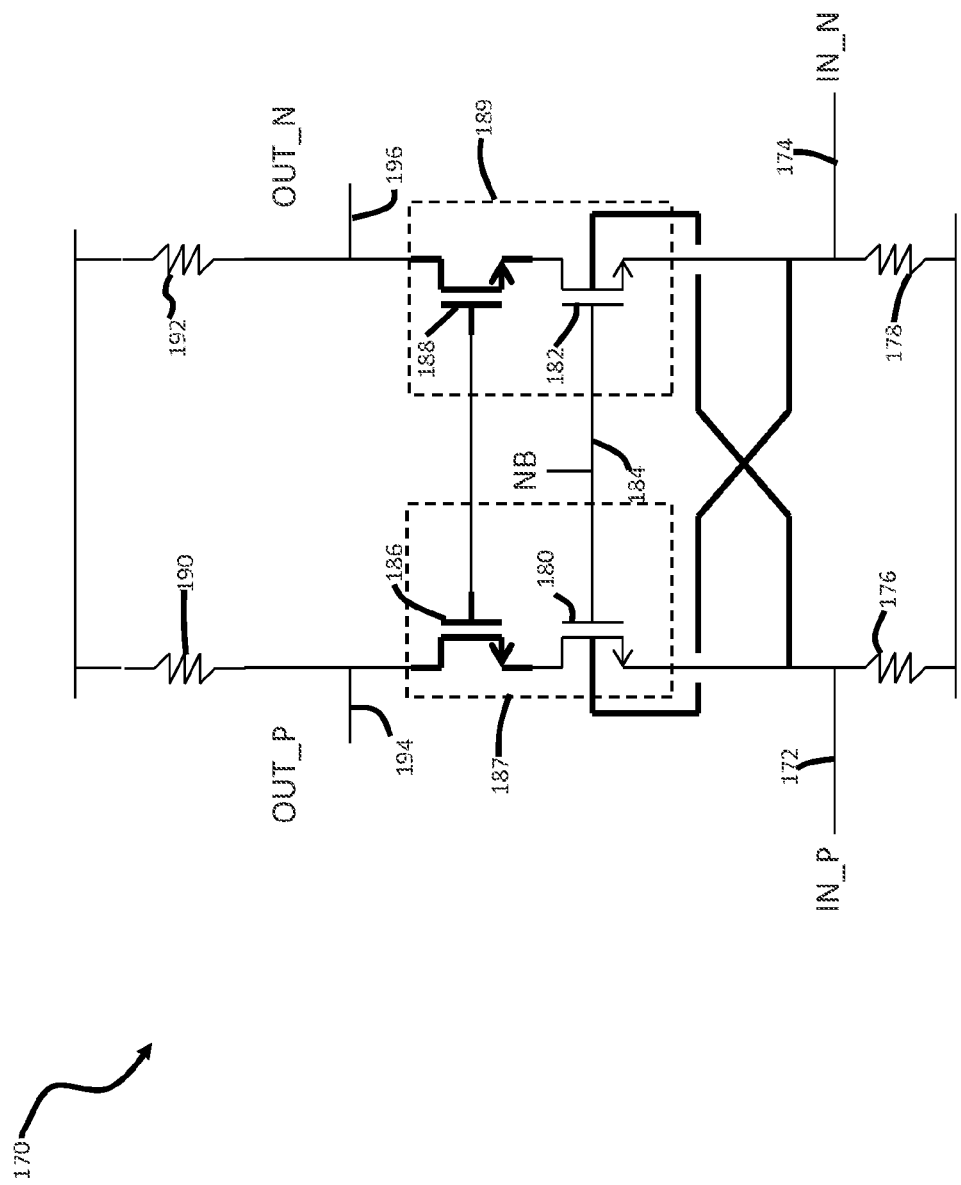
FIG. 3 illustrates an embodiment current conveyor circuit.

FIG. 3 illustrates current conveyor 170, a differential current conveyor. Current conveyor 170 may be used as current conveyor 108 or as current conveyor 120. In an example, current conveyor 170 is symmetric. A low input impedance and high output impedance are desirable for current conveyor 170, especially if current conveyor 170 is coupled to a channel filter with a high input impedance, such as channel filter 110. A high input impedance and low output impedance preserve the signal, and increase the isolation between the mixer and the load. The input resistance of the current conveyor 170 limits the noise and linearity performance of the receiver. Current conveyor 170 contains positive input 172 and negative input 174. Positive input 172 is coupled to resistor 176 and to the source of transistor 180, while negative input 174 is coupled to resistor 178 and the source of transistor 182. In an example, resistor 176 and resistor 178 have the same resistance, for example about 200 ohms. The gate of transistor 180 is coupled to the gate of transistor 182. Node 184 is between the gate of transistor 180 and the gate of transistor 182. In an example, node 184 is connected to a biasing voltage. The biasing voltage determines the amount of current drawn from the power supply by the circuit. Also, the bulk of transistor 180 is coupled to the source of transistor 182, while the bulk of transistor 182 is coupled to the source of transistor 180. The cross coupled bulks of transistor 180 and transistor 182 reduce the input impedance of current conveyor 170. In an example, transistor 180 and transistor 182 are n-type metal oxide semiconductor (NMOS) transistors.

Additionally, the source of transistor 186 is coupled to the drain of transistor 180, while the source of transistor 188 is coupled to the drain of transistor 182. The output resistance of transistor 186 may be around 10 kohms. The gate transconductance of transistor 186 may be from about 1 mS to about 10 mS, while the body transconductance of transistor 186 may be about 0.1 mS. In an example, transistor 186 and transistor 188 are NMOS transistors, where the gate of transistor 186 is coupled to the gate of transistor 188. Transistor 186 and transistor 180 form cascode 187, while transistor 188 and transistor 182 form cascode 189. Cascode 187 may have an output resistance of from about 5000 ohms to about 10,000 ohms, a gate transconductance of from about 60 mS to about 70 mS, and a body transconductance of from about 6 mS to about 7 mS. In an example, cascode 187 is similar to cascode 189. Cascode 187 and cascode 189 increase the output impedance and decrease the input impedance of current conveyor 170, but only decrease the linearity of current conveyor 170 a small amount. Also, the drain of transistor 186 is coupled to positive output 194, while the drain of transistor 188 is coupled to negative output 196. Positive output 194 is coupled to resistor 190, and negative output 196 is coupled to resistor 192. In an example, resistor 190 and resistor 192 have the same resistance, for example from about 1000 to about 2000 ohms.

The input resistance of current conveyor 170 is given by:

$$R_{in} = R_S \left\| \frac{R_O + R'_{L1}}{(g_m + 2g_{mb})R_O + 1} \right.,$$

where $R_S$ is the resistance of resistor 176, $R_O$ is the output resistance of transistor 186, $g_m$ is the gate transconductance of transistor 186, and $g_{mb}$ is the body transconductance of transistor 186. $R_{L1}'$ is given by:

$$R'_{L1} = \frac{R_{OC} + R_{L1}}{(g_{mc} + g_{mbc})R_{OC} + 1},$$

where $R_{OC}$ is the output resistance of cascode transistor 186, $R_{L1}$ is the resistance of resistor 190, $g_{mc}$ is the gate transconductance of cascode transistor 186, and $g_{mbc}$ is the body transconductance of cascode transistor 186.

Figure 4:
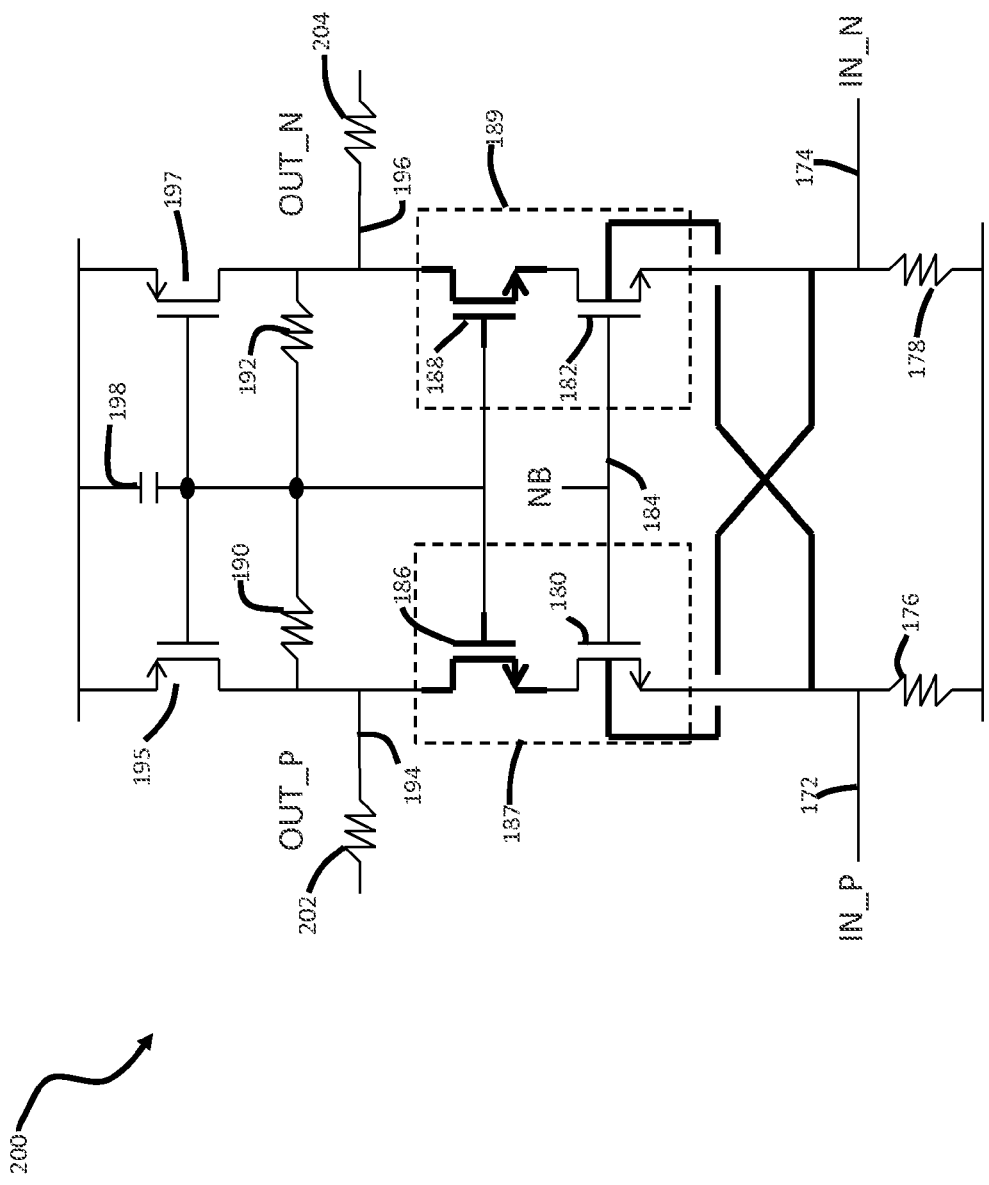
FIG. 4 illustrates an additional current conveyor circuit.

FIG. 4 illustrates current conveyor 200, which is similar to current conveyor 170. As in current conveyor 170, current conveyor 200 contains positive input 172 and negative input 174, where positive input 172 is coupled to resistor 176, and to the source of transistor 180, while negative input 174 is coupled to resistor 178 and the source of transistor 182. Also, like current conveyor 170, resistor 176 and resistor 178 are coupled to ground, and the gate of transistor 180 is coupled to transistor 182. Also, the bulk of transistor 180 is coupled to the source of transistor 182, while the bulk of transistor 182 is coupled to the source of transistor 180. Similarly, the source of transistor 186 is coupled to the drain of transistor 180, while the source of transistor 188 is coupled to the drain of transistor 180, and the gate of transistor 186 is coupled to the gate of transistor 188. The bulks of transistor 186 and transistor 188 are each coupled to ground. Also, the drain of transistor 186 is coupled to positive output 194, while the drain of transistor 188 is coupled to negative output 196. Positive output 194 is coupled to resistor 190, negative output 196 is coupled to resistor 192, and resistor 190 is coupled to resistor 192.

Current conveyor 200 also contains transistor 195, the drain of which is coupled to positive output 194, and transistor 197, the drain of which is coupled to negative output 196. In an example, transistor 195 and transistor 197 are similar, and are p-type metal oxide semiconductor (PMOS) transistors. Transistor 195 and transistor 197 cause current conveyor 200 to have higher noise than current conveyor 170. The gate of transistor 195 is coupled to the gate of transistor 197, and the source of transistor 195 is coupled to the source of transistor 197. In an example, transistor 195 and transistor 197 are self-biased. The gates of transistor 195 and transistor 197 are coupled to capacitor 198, the other terminal of which is coupled to a power supply voltage. Also, the gates of transistor 195 and transistor 197 are coupled between resistor 190 and resistor 192, and also to the gates of transistor 186 and transistor 188. Additionally, resistor 202 is coupled to positive output 194, and resistor 204 is coupled to negative output 196. In an example, resistor 202 and resistor 204 have the same resistance, for example from about 1000 ohms to about 2000 ohms.

The input resistance of current conveyor 200 is given by:

$$R_{in} = R_S \left\| \frac{R_O + R'_{L2}}{(g_m + 2g_{mb})R_O + 1} \right.,$$

where $K_{L2}'$ is given by:

$$R'_{L2} = \frac{R_{OC} + R_{L2}}{g_{mc}R_{OC} + 1}.$$

$R_{L2}$ is the resistance of resistor 202 in parallel with resistor 190 and the output resistance of transistor 195.

Figure 5:
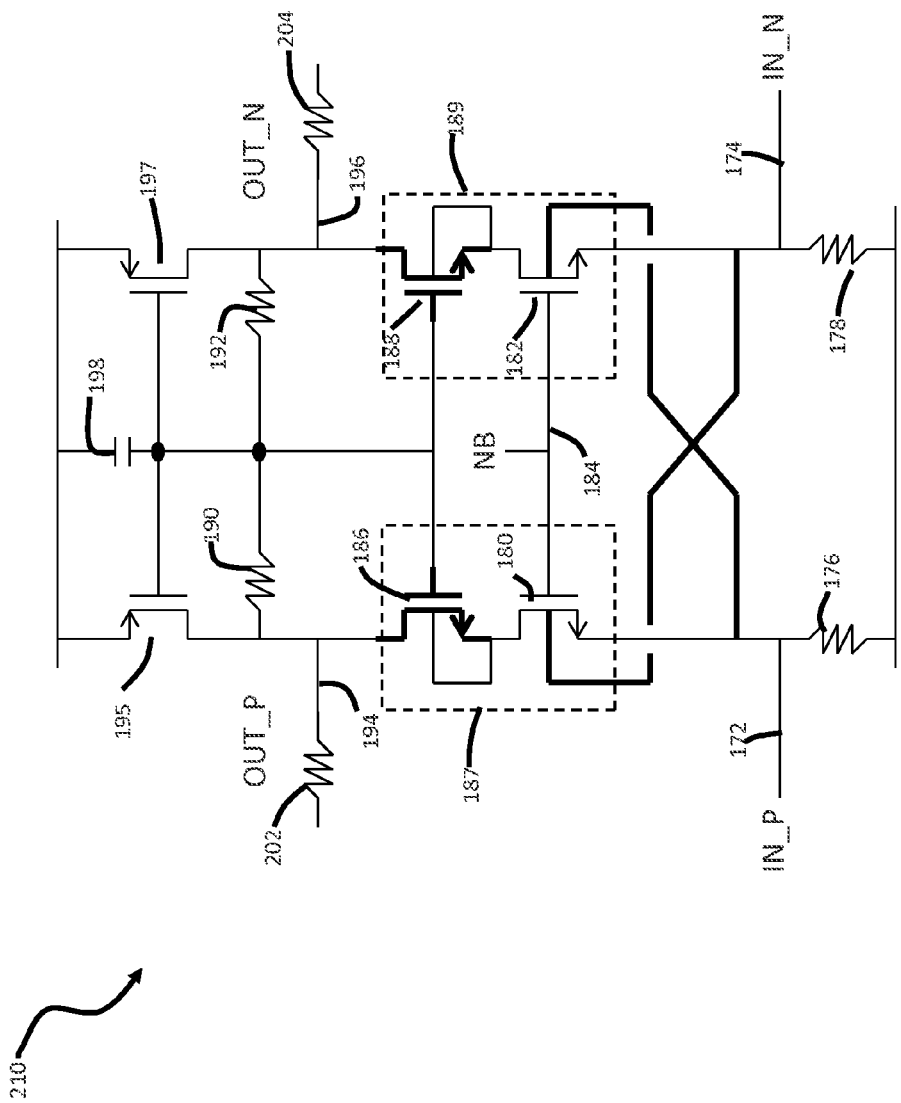
FIG. 5 illustrates another current conveyor circuit.

FIG. 5 illustrates current conveyor 210. Current conveyor 210 is similar to current conveyor 200. However, in current conveyor 210, the bulk of transistor 186 is coupled to the source of transistor 186, and the bulk of transistor 188 is coupled to the source of transistor 188. The input resistance of current conveyor 210 is given by:

$$R_{in} = R_S \left\| \frac{R_O + R'_{L3}}{(g_m + 2g_{mb})R_O + 1} \right.,$$

where $R_{L3}'$ is given by:

$$R'_{L3} = \frac{R_{OC} + R_{L2}}{g_{mc}R_{OC} + 1}.$$

With the same size devices and biasing currents, the input resistance of current conveyor 210 is larger than the input resistance of current conveyor 200, because the bulk transconductance of cascode transistor 186 affecting current conveyor 200 does not decrease the input resistance in current conveyor 210, as it does in current conveyor 200.

Advantages of an embodiment current conveyor include achieving a low input impedance, good load isolation, and high output impedance in a small size, and with low power dissipation. Also, an embodiment achieves a high bandwidth for a given flicker noise target. In an example, the use of cascodes leads to a low input resistance of a current conveyor. In another example, the cross coupling of the bulks of transistors leads to a low input resistance of a current conveyor.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A circuit comprising:
   a first transistor comprising a first gate coupled to a first node, a first source coupled to a second node, a first drain coupled to a third node, and a first bulk coupled to a fourth node;
   a first terminal of a first resistor coupled to the third node, wherein a second terminal of the first resistor is coupled to a fifth node;
   a second transistor comprising a second gate, a second source, a second drain, and a second bulk, wherein the second drain of the second transistor is coupled to the second node, wherein the second gate of the second transistor is coupled to a sixth node, wherein the second source of the second transistor is coupled to a seventh node, and wherein the second bulk of the second transistor is coupled to an eighth node;
   a third transistor comprising a third gate, a third source, a third drain, and a third bulk, wherein the third gate of the third transistor is coupled to the first node, wherein the third source is coupled to a ninth node, wherein the third drain of the third transistor is coupled to a tenth node, and wherein the third bulk of the third transistor is coupled to an eleventh node;
   a third terminal of a second resistor coupled to the tenth node, wherein a fourth terminal of the second resistor is coupled to the fifth node; and
   a fourth transistor comprising a fourth gate, a fourth source, a fourth drain, and a fourth bulk, wherein the fourth drain of the fourth transistor is coupled to the ninth node, wherein the fourth gate of the fourth transistor is coupled to the sixth node, wherein the fourth bulk of the fourth transistor is coupled to the seventh node, and wherein the fourth source of the fourth transistor is coupled to the eighth node.

2. The circuit of claim 1, wherein the circuit further comprises:
   a fifth terminal of a third resistor coupled to the seventh node, wherein the third resistor comprises the fifth terminal and a sixth terminal coupled to a twelfth node; and
   a seventh terminal of a fourth resistor coupled to the eighth node, wherein an eighth terminal of the fourth resistor is coupled to the twelfth node.

3. The circuit of claim 1, wherein the first transistor comprises a first n-channel metal oxide semiconductor field effect transistor (NMOS) transistor, wherein the second transistor comprises a second NMOS transistor, wherein the third transistor comprises a third NMOS transistor, and wherein the fourth transistor comprises a fourth NMOS transistor.

4. The circuit of claim 1, further comprising:
   a fifth resistor coupled to the third node; and
   a sixth resistor coupled to the tenth node.

5. The circuit of claim 1, further comprising:
   a fifth drain of a fifth transistor coupled to the third node, wherein the fifth transistor comprises the fifth drain, a fifth source coupled to a thirteenth node, a fifth gate coupled to the fifth node, and a fifth bulk; and
   a sixth drain of a sixth transistor coupled to the tenth node, wherein the sixth transistor comprises the sixth drain, a sixth source coupled to the thirteenth node, a sixth gate coupled to the fifth node, and a sixth bulk.

6. The circuit of claim 5, wherein the circuit further comprises a fifth terminal of a capacitor coupled to the fifth node, and wherein a sixth terminal of the capacitor is coupled to the thirteenth node.

7. The circuit of claim 5, wherein the fifth transistor comprises a first p-channel metal oxide semiconductor field effect transistor (PMOS) transistor, and wherein the sixth transistor comprises a second PMOS transistor.

8. The circuit of claim 5, wherein the first bulk of the first transistor is coupled to the first source of the first transistor, and wherein the third bulk of the third transistor is coupled to the third source of the third transistor.

9. The circuit of claim 1, further comprising a first channel filter coupled to the third node.

10. The circuit of claim 9, further comprising a first variable gain amplifier coupled to the first channel filter.

11. The circuit of claim 10, further comprising:
    a first down-mixer coupled to the seventh node; and
    a second variable gain amplifier coupled to the first down-mixer, wherein the second variable gain amplifier is configured to receive an input signal.

12. The circuit of claim 11, wherein the input signal is a radio frequency (RF) signal comprising an I component and a Q component.

13. The circuit of claim 11, further comprising:
a second down-mixer coupled to the first variable gain amplifier; and
a current conveyer coupled to the second down mixer, wherein the current conveyer comprises
a first cascode, and
a second cascode.

14. The circuit of claim 13, further comprising:
a second channel filter coupled to the current conveyer; and
a third variable gain amplifier coupled to the second channel filter.

15. The circuit of claim 14, wherein an integrated circuit comprises the first variable gain amplifier, the first down-mixer, the second down-mixer, the current conveyer, the first channel filter, the second channel filter, the second variable gain amplifier, the third variable gain amplifier, the first transistor, the second transistor, the third transistor, the fourth transistor, the first resistor, and the second resistor.

16. The circuit of claim 10, wherein the first variable gain amplifier is coupled to a digital filter.

17. The circuit of claim 10, further comprising:
an analog-to-digital converter coupled to the first variable gain amplifier; and
a digital filter coupled to the analog-to-digital converter.

18. The circuit of claim 17, wherein the digital filter comprises a digital signal processor (DSP).

19. The circuit of claim 9, wherein the first channel filter comprises:
a third resistor coupled to the third node; and
a first op amp coupled to the third resistor.

20. The circuit of claim 19, wherein the first channel filter further comprises:
a fourth resister coupled to the tenth node; and
a second op amp coupled to the first op amp.

21. The circuit of claim 9, wherein the first channel filter is a differential low pass filter.

* * * * *